United States Patent
Hsu

(10) Patent No.: US 12,094,517 B2
(45) Date of Patent: Sep. 17, 2024

(54) WORD LINE PUMP DEVICE OF DYNAMIC RANDOM ACCESS MEMORY CHIP AND CLAMP CIRCUIT THEREOF

(71) Applicant: NANYA TECHNOLOGY CORPORATION, New Taipei (TW)

(72) Inventor: Ting-Shuo Hsu, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 157 days.

(21) Appl. No.: 17/994,397

(22) Filed: Nov. 28, 2022

(65) Prior Publication Data

US 2024/0177763 A1    May 30, 2024

(51) Int. Cl.
*G11C 11/4074* (2006.01)
*G11C 11/408* (2006.01)

(52) U.S. Cl.
CPC ...... *G11C 11/4074* (2013.01); *G11C 11/4085* (2013.01)

(58) Field of Classification Search
CPC .......... G11C 11/4074; G11C 11/4085
USPC .......................................... 365/226
See application file for complete search history.

(56) References Cited

U.S. PATENT DOCUMENTS

| | | | |
|---|---|---|---|
| 5,367,489 A | 11/1994 | Park et al. | |
| 5,510,749 A * | 4/1996 | Arimoto | G05F 1/465 327/332 |
| 5,587,951 A | 12/1996 | Jazayeri et al. | |
| 7,200,051 B2 | 4/2007 | Takeuchi | |
| 10,348,194 B1 * | 7/2019 | Chen | G11C 5/145 |
| 2002/0171461 A1 | 11/2002 | Yamazaki et al. | |

FOREIGN PATENT DOCUMENTS

CN    113345492    9/2021

OTHER PUBLICATIONS

"Office Action of Taiwan Counterpart Application", issued on Jan. 16, 2024, p. 1-p. 5.

* cited by examiner

*Primary Examiner* — Alexander Sofocleous
*Assistant Examiner* — Tracy R Hampton
(74) *Attorney, Agent, or Firm* — JCIPRNET

(57) ABSTRACT

A word line pump device of a dynamic random access memory (DRAM) chip and a clamp circuit thereof are provided. The DRAM chip receives a first voltage and a second voltage from outside, and the first voltage is smaller than the second voltage. The clamp circuit clamps a word line voltage to the second voltage in response to the word line pump device not receiving a power supply voltage.

10 Claims, 2 Drawing Sheets

WORD LINE PUMP DEVICE OF DYNAMIC RANDOM ACCESS MEMORY CHIP AND CLAMP CIRCUIT THEREOF

BACKGROUND

Technical Field

The disclosure relates to an electronic device, and in particular to a word line pump device for a dynamic random access memory chip and its clamp circuit.

Description of Related Art

Conventional word line pump devices first clamp a word line voltage to a power supply voltage during power up, and then boosts the word line voltage from the power supply voltage to a target word line driving voltage. However, when the voltage difference between the target word line driving voltage and the power supply voltage is too large, excessive peak current will be generated, which may cause the dynamic random access memory chip to operate abnormally.

SUMMARY

The disclosure provides a word line pump device of a dynamic random access memory chip and a clamp circuit thereof, which helps to avoid abnormal operation of the dynamic random access memory chip due to excessive peak current.

The word line pump device of the dynamic random access memory chip of the disclosure is adapted to provide a word line voltage to a word line of the dynamic random access memory chip. The dynamic random access memory chip receives a first voltage and a second voltage from outside. The first voltage is smaller than the second voltage. The word line pump device includes a power detecting circuit, a clamp circuit, an oscillator circuit, and a pump circuit. The power detecting circuit detects whether the word line pump device receives a power supply voltage and outputs a power-on indication signal correspondingly. The clamp circuit is coupled to the power detecting circuit and clamps the word line voltage to the second voltage according to the power-on indication signal in response to the word line pump device not receiving the power supply voltage. The oscillator circuit is coupled to the power detecting circuit and provides a clock signal according to the power-on indication signal in response to the word line pump device receiving the power supply voltage. The pump circuit is coupled to the oscillator circuit and boosts the word line voltage to a target word line driving voltage according to the clock signal.

In an embodiment of the disclosure, the clamp circuit includes a first transistor coupled between the second voltage and an output end of the word line pump device. A gate end of the first transistor is coupled to the power detecting circuit, turned on by the power-on indication signal in response to the word line pump device not receiving the power supply voltage, and disconnected in response to the word line pump device receiving the power supply voltage.

In an embodiment of the disclosure, the word line pump device further includes an inverter and a second transistor. The input end of the inverter is coupled to the power detecting circuit. The second transistor is coupled between the gate end of the first transistor and a reference voltage, turned on in response to the word line pump device not receiving the power supply voltage to pull down a voltage of the gate end of the first transistor, and disconnected in response to the word line pump device receiving the power supply voltage.

In an embodiment of the disclosure, the above reference voltage is the grounding voltage.

In an embodiment of the disclosure, the first transistor is a p-type transistor and the second transistor is an n-type transistor.

In an embodiment of the disclosure, the first voltage is the power supply voltage and the second voltage is an activating voltage of the dynamic random access memory chip.

The disclosure also provides a clamp circuit of a word line pump device suitable for a dynamic random access memory chip. The dynamic random access memory chip receives a first voltage and a second voltage from outside, the first voltage is smaller than the second voltage. The clamp circuit includes an inverter, a first transistor, and a second transistor. An input end of the inverter receives a power-on indication signal and the power-on indication signal indicates whether the word line pump device receives a power supply voltage. The first transistor is coupled between the second voltage and an output end of the word line pump device. A gate end of the first transistor is configured to receive the power-on indication signal and is turned on in response to the word line pump device not receiving the power supply voltage and disconnected in response to the word line pump device receiving the power supply voltage. The second transistor is coupled between the gate end of the first transistor and a reference voltage, turned on in response to the word line pump device not receiving the power supply voltage to pull down a voltage of the gate end of the first transistor, and disconnected in response to the word line pump device receiving the power supply voltage.

In an embodiment of the disclosure, the reference voltage is a grounding voltage.

In an embodiment of the disclosure, the first transistor is a p-type transistor and the second transistor is an n-type transistor.

In an embodiment of the disclosure, the first voltage is the power supply voltage and the second voltage is an activating voltage of the dynamic random access memory chip.

Based on the above, the clamp circuit of the embodiment of the disclosure clamps the word line voltage between the first voltage and the second voltage received from outside by the dynamic random access memory chip according to the power-on indication signal in response to the word line pump device not receiving the power supply voltage. The second voltage has a larger voltage value to avoid excessive peak currents caused by the voltage difference between the target word line driving voltage and the clamped voltage of the clamp circuit being too large, thereby avoiding the abnormal operation of the dynamic random access memory chip due to excessive peak current.

In order to make the above-mentioned features and advantages of the disclosure comprehensible, embodiments accompanied with drawings are described in detail below.

DESCRIPTION OF THE EMBODIMENTS

Figure 1:
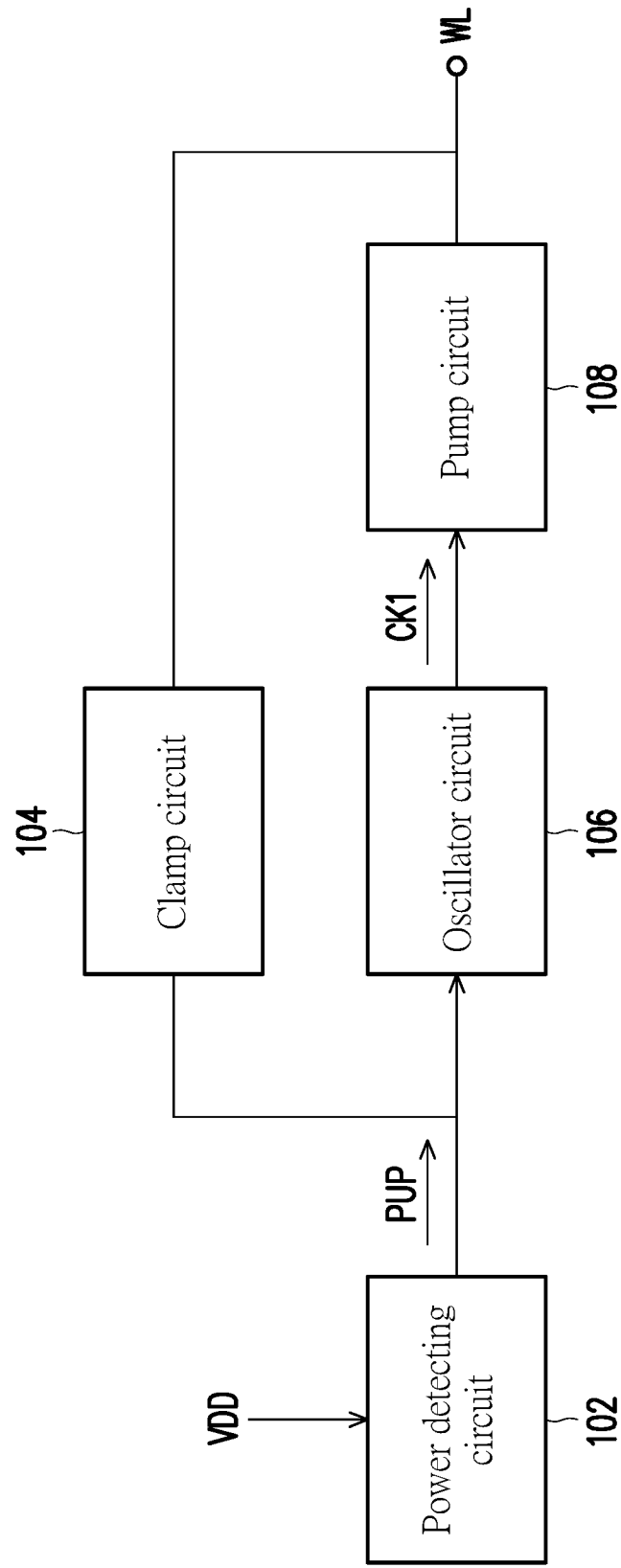
FIG. 1 is a schematic view of a word line pump device of a dynamic random access memory chip according to an embodiment of the disclosure.

FIG. 1 is a schematic view of a word line pump device of a dynamic random access memory chip according to an embodiment of the disclosure. Referring to FIG. 1, the word line pump device includes a power detecting circuit 102, a clamp circuit 104, an oscillator circuit 106, and a pump circuit 108. The clamp circuit 104 is coupled to the power detecting circuit 102 and a word line WL. The oscillator circuit 106 is coupled to the power detecting circuit 102 and the pump circuit 108. The pump circuit 108 is further coupled to the word line WL.

The dynamic random access memory chip may receive a first voltage and a second voltage from outside, the first voltage is smaller than the second voltage. The first voltage may be, for example, a power supply voltage (VDD), and the second voltage may be, for example, an activating voltage (VPP) of the dynamic random access memory chip, but not limited thereto. The power detecting circuit 102 is configured to detect whether the word line pump device receives the power supply voltage VDD and output a power-on indication signal PUP correspondingly. The power-on indication signal PUP is configured to indicate whether the power detecting circuit 102 detects the power supply voltage VDD. During startup, the clamp circuit 104 clamps the voltage of the word line WL to the second voltage according to the power-on indication signal PUP in response to the power detecting circuit 102 not detecting a power supply voltage VDD. The oscillator circuit 106 may provide a clock signal CK1 to the pump circuit 108 according to the power-on indication signal PUP in response to the power detecting circuit 102 detecting a power supply voltage VDD, so that the pump circuit 108 boosts the voltage of the word line WL to a target word line driving voltage according to the clock signal CK1.

In this way, the clamp circuit 104 may clamp the voltage of the word line WL between the first voltage and the second voltage received from outside by the dynamic random access memory chip in response to the power detecting circuit 102 not detecting a power supply voltage VDD. The second voltage has a larger voltage value to avoid excessive peak currents caused by the voltage difference between the target word line driving voltage and the clamped voltage of the clamp circuit 104 being too large, thereby avoiding the abnormal operation of the dynamic random access memory chip due to excessive peak current.

Figure 2:
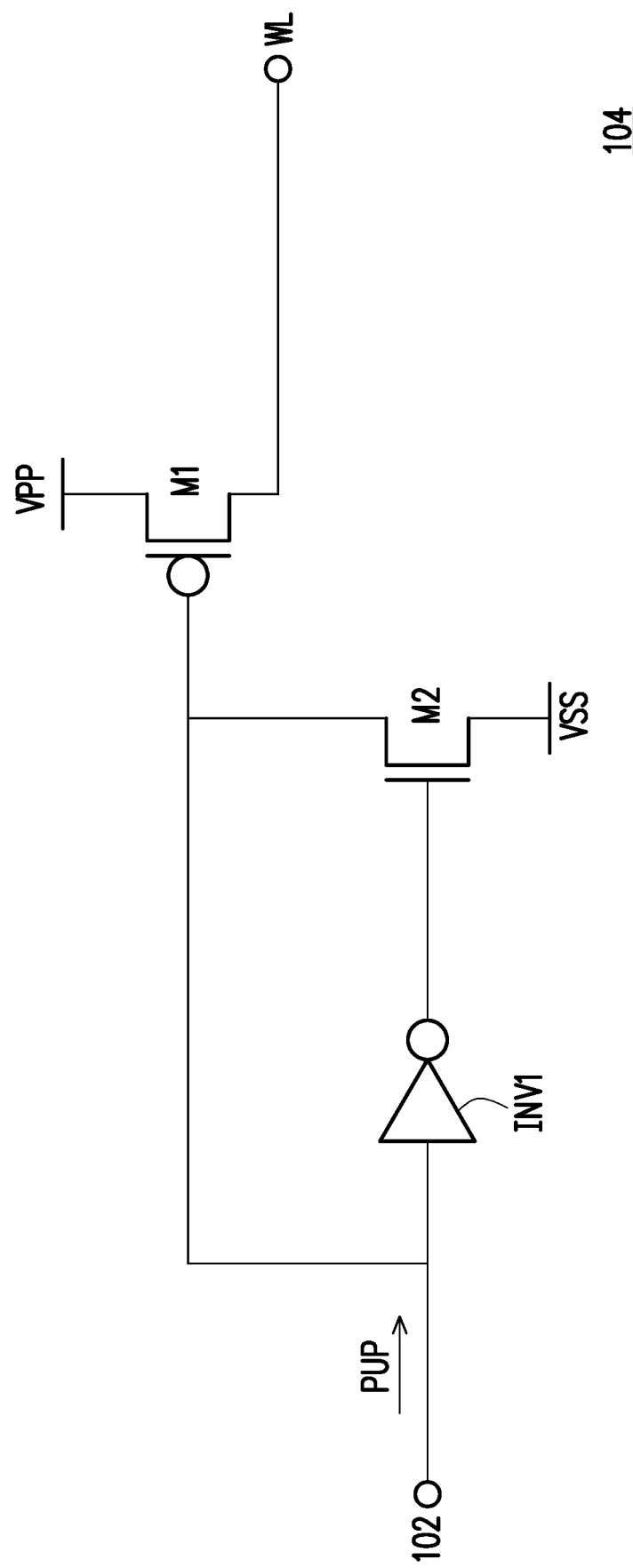
FIG. 2 is a schematic view of a clamp circuit of a word line pump device according to another embodiment of the disclosure.

Furthermore, the implementation of the clamp circuit 104 may be as shown in FIG. 2, including a transistor M1, a transistor M2, and an inverter INV1. The transistor M1 is coupled between an activating voltage VPP (second voltage) of the dynamic random access memory chip. A gate of the transistor M1 is coupled to the power detecting circuit 102. The inverter INV1 is coupled between the power detecting circuit 102 and a gate of the transistor M2. The transistor M2 is coupled to the gate of the transistor M1 and a reference voltage VSS. In this embodiment, the transistor M1 is a p-type transistor, the transistor M2 is an n-type transistor, and the reference voltage VSS is a grounding voltage, but not limited thereto.

In response to the power detecting circuit 102 not detecting the power supply voltage VDD, the power detecting circuit 102 may output a power-on indication signal PUP with a low voltage level and turn on the transistor M1 and transistor M2. Therefore, the activating voltage VPP is supplied to the word line WL through the transistor M1, and the voltage of the word line WL is clamped at the activating voltage VPP. In response to the power detecting circuit 102 detecting the power supply voltage VDD, the power detecting circuit 102 may output a power-on indication signal PUP with a high voltage level and disconnect the transistor M1 and the transistor M2. At this moment, the voltage of the word line WL is changed to be boosted by the pump circuit 108 of the embodiment of FIG. 1 from the activating voltage VPP to the target word line driving voltage according to the clock signal CK1. The power supply voltage VDD may be, for example, 1.1V; the activating voltage VPP may be, for example, 1.8V; the target word line driving voltage may be, for example, 3V, but not limited thereto. In this way, the voltage of the word line WL is first clamped at the activating voltage VPP, and then boosted to the target word line driving voltage, thereby avoiding the abnormal operation of the dynamic random access memory chip due to excessive peak current.

It is worth mentioning that the inverter INV1 and the transistor M2 may further lower the gate voltage activating voltage VPP of the transistor M1 in response to the power detecting circuit 102 not detecting the power supply voltage VDD, which ensures that the clamp circuit 104 quickly clamps the voltage of the word line WL to the activating voltage VPP. However, depending on actual needs, in some embodiments, the use of inverter INV1 and transistor M2 may also be omitted to simplify the clamp circuit 104.

To sum up, the clamp circuit of the embodiment of the disclosure clamps the word line voltage between the first voltage and the second voltage received from outside by the dynamic random access memory chip according to the power-on indication signal in response to the word line pump device not receiving the power supply voltage. The second voltage has a larger voltage value to avoid excessive peak currents caused by the voltage difference between the target word line driving voltage and the clamped voltage of the clamp circuit being too large, thereby avoiding the abnormal operation of the dynamic random access memory chip due to excessive peak current.

What is claimed is:

1. A word line pump device of a dynamic random access memory chip, adapted to provide a word line voltage to a word line of the dynamic random access memory chip, wherein the dynamic random access memory chip receives a first voltage and a second voltage from outside, the first voltage is smaller than the second voltage, and the word line pump device comprises:
    a power detecting circuit, detecting whether the word line pump device receives a power supply voltage and outputting a power-on indication signal correspondingly;
    a clamp circuit, coupled to the power detecting circuit and clamping the word line voltage to the second voltage according to the power-on indication signal in response to the word line pump device not receiving the power supply voltage;
    an oscillator circuit, coupled to the power detecting circuit and providing a clock signal according to the power-on indication signal in response to the word line pump device receiving the power supply voltage; and
    a pump circuit, coupled to the oscillator circuit and boosting the word line voltage to a target word line driving voltage according to the clock signal.

2. The word line pump device according to claim 1, wherein the clamp circuit comprises:
    a first transistor, coupled between the second voltage and an output end of the word line pump device, wherein a gate end of the first transistor is coupled to the power detecting circuit, turned on by the power-on indication signal in response to the word line pump device not receiving the power supply voltage, and disconnected in response to the word line pump device receiving the power supply voltage.

3. The word line pump device according to claim 2, further comprising:
- an inverter with an input end coupled to the power detecting circuit; and
- a second transistor, coupled between the gate end of the first transistor and a reference voltage, turned on in response to the word line pump device not receiving the power supply voltage to pull down a voltage of the gate end of the first transistor, and disconnected in response to the word line pump device receiving the power supply voltage.

4. The word line pump device according to claim 3, wherein the reference voltage is a grounding voltage.

5. The word line pump device according to claim 3, wherein the first transistor is a p-type transistor and the second transistor is an n-type transistor.

6. The word line pump device according to claim 1, wherein the first voltage is the power supply voltage and the second voltage is an activating voltage of the dynamic random access memory chip.

7. A clamp circuit of a word line pump device, suitable for a dynamic random access memory chip, wherein the dynamic random access memory chip receives a first voltage and a second voltage from outside, the first voltage is smaller than the second voltage, and the clamp circuit comprises:
- an inverter with an input end receiving a power-on indication signal, wherein the power-on indication signal indicates whether the word line pump device receives a power supply voltage;
- a first transistor, coupled between the second voltage and an output end of the word line pump device, wherein a gate end of the first transistor is configured to receive the power-on indication signal and is turned on in response to the word line pump device not receiving the power supply voltage and disconnected in response to the word line pump device receiving the power supply voltage; and
- a second transistor, coupled between the gate end of the first transistor and a reference voltage, turned on in response to the word line pump device not receiving the power supply voltage to pull down a voltage of the gate end of the first transistor, and disconnected in response to the word line pump device receiving the power supply voltage.

8. The clamp circuit of the word line pump device according to claim 7, wherein the reference voltage is a grounding voltage.

9. The clamp circuit of the word line pump device according to claim 7, wherein the first transistor is a p-type transistor and the second transistor is an n-type transistor.

10. The clamp circuit of the word line pump device according to claim 7, wherein the first voltage is the power supply voltage and the second voltage is an activating voltage of the dynamic random access memory chip.

* * * * *